United States Patent
Rehwald et al.

(10) Patent No.: US 9,030,201 B2
(45) Date of Patent: May 12, 2015

(54) SYSTEM AND METHOD FOR INDEPENDENT MANIPULATION OF A FAT AND A WATER COMPONENT IN MAGNETIC RESONANCE IMAGING

(75) Inventors: Wolfgang G. Rehwald, Chapel Hill, NC (US); Elizabeth R. Jenista, Durham, NC (US); Raymond J. Kim, Chapel Hill, NC (US)

(73) Assignees: Siemens Medical Solutions USA, Inc., Malvern, PA (US); Duke University, Durham, NC (US)

( * ) Notice: Subject to any disclaimer, the term of this patent is extended or adjusted under 35 U.S.C. 154(b) by 537 days.

(21) Appl. No.: 13/352,620

(22) Filed: Jan. 18, 2012

(65) Prior Publication Data

US 2012/0194193 A1    Aug. 2, 2012

Related U.S. Application Data

(60) Provisional application No. 61/436,642, filed on Jan. 27, 2011.

(51) Int. Cl.
*G01V 3/00* (2006.01)
*G01R 33/48* (2006.01)
*G01R 33/56* (2006.01)

(52) U.S. Cl.
CPC ........ *G01R 33/4828* (2013.01); *G01R 33/5607* (2013.01)

(58) Field of Classification Search
USPC .......................................... 324/307, 309, 306
See application file for complete search history.

(56) References Cited

U.S. PATENT DOCUMENTS

| 4,661,775 A | 4/1987 | Kormos et al. |
| 4,771,242 A | 9/1988 | Lampman et al. |

(Continued)

FOREIGN PATENT DOCUMENTS

| CN | 1098893 A | 2/1995 |
| CN | 1598556 A | 3/2005 |

(Continued)

OTHER PUBLICATIONS

J Debecker, T Rozjin, F Visser, A Jones, Wh Beekman, Silicone Only Breast MRI using an Inversion Recovery TSE sequence with a B1-independent Spectral Selective Water Suppression Prepulse (SPAIR), Proc. Intl. Soc. Mag. Reson. Med. 13 (2005).

(Continued)

*Primary Examiner* — Louis Arana
(74) *Attorney, Agent, or Firm* — Peter R. Withstandley

(57) ABSTRACT

An MR imaging system independently manipulates a fat and a water component of MR signals used for generating image data. An RF signal generator and a magnetic field gradient generator provide an RF pulse and magnetic field gradient sequence for acquisition of an MR signal discriminating between anatomical objects based on longitudinal relaxation time (T1). The sequence comprises, a first pulse sequence for selectively inverting a water component of the MR signal substantially exclusively of fat, a first time delay adjustable to discriminate between different anatomical elements, a second pulse sequence having a resonant frequency selected to invert a fat component of the MR signal substantially exclusively of water and a data acquisition magnetic field gradient for acquisition of the MR signal. An image shows enhanced visualization of discriminated anatomical elements.

20 Claims, 12 Drawing Sheets

(56) References Cited

U.S. PATENT DOCUMENTS

| | | | |
|---|---|---|---|
| 4,893,080 | A | 1/1990 | Luyten et al. |
| 4,962,357 | A | 10/1990 | Sotak |
| 5,041,787 | A * | 8/1991 | Luyten .......... 324/309 |
| 5,144,235 | A | 9/1992 | Glover et al. |
| 5,321,359 | A | 6/1994 | Schneider |
| 5,429,134 | A | 7/1995 | Foo |
| 6,016,057 | A | 1/2000 | Ma |
| 6,091,242 | A * | 7/2000 | Hanawa .......... 324/307 |
| 6,272,369 | B1 | 8/2001 | Tan |
| 6,483,308 | B1 | 11/2002 | Ma et al. |
| 7,099,499 | B2 | 8/2006 | Blezek et al. |
| 7,323,871 | B2 * | 1/2008 | Foo .......... 324/307 |
| 7,924,003 | B2 | 4/2011 | Yu et al. |
| 2008/0218169 | A1 | 9/2008 | Bookwalter et al. |
| 2009/0027051 | A1 | 1/2009 | Stuber et al. |
| 2010/0066365 | A1 | 3/2010 | Bookwalter et al. |
| 2010/0127702 | A1 | 5/2010 | Greiser et al. |
| 2010/0260397 | A1 | 10/2010 | Block et al. |
| 2010/0283463 | A1 | 11/2010 | Lu et al. |
| 2011/0210733 | A1 | 9/2011 | Wheaton et al. |

FOREIGN PATENT DOCUMENTS

| | | |
|---|---|---|
| CN | 101002677 A | 7/2007 |
| CN | 101327123 A | 12/2008 |
| CN | 101836123 A | 9/2010 |

OTHER PUBLICATIONS

Eleni Kaldoudi, Steve C R Williams, Gareth J Barker and Paul S Tofts, "A Chemical Shift Selective Inversion Recovery Sequence for Fat-Suppressed MRI: Theory and Experimental Validation", Magnetic Resonance Imaging, vol. 11, pp. 341-355, 1993.

A Haase, J Frahm, W Hanicke and D Mathaei, "H NMR chemical shift selective (CHESS) imaging", Phys. Med. Biol. 1985, vol. 30, No. 4, 341-344. Printed in Great Britain.

W Thomas Dixon, "Simple Proton Spectroscopic Imaging", Radiology 1984; 153: 189-194.

Mamoru Niitsu, Eriko Tohno, and Yuji Itai, "Fat Suppression Strategies in Enhanced MR Imaging of the Breast: Comparison of SPIR and Water Excitation Sequences", Journal of Magnetic Resonance Imaging 18: 310-314 (2003).

D Hernando, JP Haldar, BP Suton, J Ma, P Kellman and Z-P Liang, "Joint Estimation of Water/Fat Images and Field Inhomogeneity Map", Magnetic Resonance in Medicine 59:571-580 (2008).

Scott B Reeder, et al., "Water-Fat Separation With Ideal Gradient-Echo Imaging", Journal of Magnetic Resonance Imaging 25:644-652 (2007).

Peter Kellman, et al., "Multiecho Dixon Fat and Water Separation method for Detecting Fibrofatty Infiltration in the Myocardium", Magnetic Resonance in Medicine 61:215-221 (2009).

Thomas C. Lauenstein, "Spectral Adiabatic Inversion Recovery (SPAIR) MR imaging of the Abdomen", MAGNETOM Flash, Feb. 2008, www.siemens.com/magnetom-world.

Manojkumar Saranathan, et al., "Multiecho Time-Resolved Acquisition (META): A High Spatiotemporal Resolution Dixon Imaging Sequence for Dynamic Contrast-Enhanced MRI", Journal of Magnetic Resonance Imaging 29: 1406-1413 (2009).

David Purdy, "The Skinny on FatSat", Siemens Medical Solutions USA, Inc., brochure.

Peter J Lunniss et al., "Magnetic Resonance Imaging of Fistula-in-ano", Diseases of the Colon & Rectum, vol. 37, No. 7, 708-718.

Thomas C Lauenstein, et al., "Evaluation of Optimized Inversion-Recovery Fat-Suppression Techniques for T2-Weighted Abdominal MR Imaging", Journal of Magnetic Resonance Imaging 27: 1448-1454 (2008).

Office Action dated Jan. 30, 2015 in CN Application No. 201210087943.3 (English translation included).

* cited by examiner ical segmented inversion recovery protocols which acquire only a fraction of the data known as a segment (typically 21-29 lines per segment). In the common linear reordering scheme, by the time the k-space center is acquired, the fat magnetization has significantly recovered due to its short T1 (T1 of fat=230 ms at 1.5 T, 290 ms at 3 T) and is thus poorly suppressed. The fat signal has recovered even more in the case of single-shot imaging where the center of k-space is typically acquired 100 ms to 120 ms after the fat suppression pulse. This method works poorly at 1.5 T and better, but still
SYSTEM AND METHOD FOR INDEPENDENT MANIPULATION OF A FAT AND A WATER COMPONENT IN MAGNETIC RESONANCE IMAGING This is a non-provisional application of provisional application Ser. No. 61/436,642 filed 27 Jan. 2011, by W. G. Rehwald et al.

FIELD OF THE INVENTION

This invention concerns a system for manipulating a fat and a water component of MR signals used for generating image data and discriminating between anatomical objects based on longitudinal relaxation time (T1).

BACKGROUND OF THE INVENTION

T1-weighted inversion recovery (IR) imaging is a common method used in Magnetic Resonance Imaging (MRI) that is frequently performed in conjunction with suppression of fat signal. T1 is the time constant that describes the rate of recovery of longitudinal magnetization. T1-weighted IR is used for imaging different pathophysiologies in different regions of the body, including but not limited to the heart, brain, and vasculature. This method can be used with or without the administration of a T1-shortening contrast agent. Fat suppression methods are used to make fat appear dark in MR images so that other bright structures can be visualized without being confounded by bright fat, for example infarcted myocardium in contrast enhanced delayed enhancement imaging of the heart. Known different fat suppression methods, when combined with T1-weighted IR (for example in contrast-enhanced MR angiography or delayed enhancement) work poorly or not at all.

A known inversion recovery pulse is used in MRI to create T1-image contrast so image elements with a short T1 value ("short T1-species") appear bright, and long-T1 species appear dark in such images. Fat appears bright due to its short T1 value and its abundance in most patients. This can be a problem in image interpretation as it may be difficult to discriminate fat from the other short T1-species present in the image and this is important for making a clinical diagnosis. Another such short T1-species for example is blood with contrast agent in contrast-enhanced MR angiography, or infarcted (dead) myocardium (heart tissue) in contrast-enhanced delayed enhancement. Using delayed enhancement as a specific example, a bright fat signal can obscure the presence of bright infarcted myocardium, or fat can be mistaken for infarct. In arrhythmogenic right ventricular dysplasia (ARVD), the discrimination between fat and equally bright scar tissue is important and is difficult with known systems.

A common application of fat signal manipulation is fat suppression. One known fat suppression method uses a fat-frequency selective saturation recovery (SR) pulse played immediately before readout of data. This method is not optimal in clinical segmented inversion recovery protocols which acquire only a fraction of the data known as a segment (typically 21-29 lines per segment). In the common linear reordering scheme, by the time the k-space center is acquired, the fat magnetization has significantly recovered due to its short T1 (T1 of fat=230 ms at 1.5 T, 290 ms at 3 T) and is thus poorly suppressed. The fat signal has recovered even more in the case of single-shot imaging where the center of k-space is typically acquired 100 ms to 120 ms after the fat suppression pulse. This method works poorly at 1.5 T and better, but still not proficiently, at 3 T field strength. Centric reordering improves this fat suppression method, but is prone to image artifacts.

A STIR (short tau inversion recovery) pulse sequence provides another known fat suppression method. This method is used in connection with turbo-spin echo (TSE) readout and dark-blood (DB) preparation. One non-frequency selective but usually spatially-selective IR (NFSIR) pulse is played timed to null the fat at the beginning of the TSE readout and not the center of k-space. STIR suppresses fat well due to the nature of the TSE readout; the first TSE readout pulse is a 90 degrees pulse that "locks in" the nulled fat signal (after that pulse, the longitudinal relaxation of fat is irrelevant for the remainder of the readout). Gradient echo (GRE, Siemens proprietary name Flash, fast low angle shot) and steady state free precession (SSFP, Siemens proprietary name TrueFisp, true fast imaging with steady precession) readouts do not have this "lock-in" property and thus require different timing between the NFSIR pulse and the beginning of the readout. Such timing restricts the maximum number of lines per segment, often below a clinically useful value. Thus, the STIR sequence works only in combination with the TSE readout.

Furthermore, STIR works with a single inversion time which is used to null fat. It is substantially impossible to apply an additional non-frequency selective IR pulse to impart T1-contrast, as the application of both pulses unfavorably alters the image contrast and prevents the suppression of fat signal. In addition, a dark blood (DB) preparation is required to be used with the STIR method to avoid image artifacts. DB preparation is restricted to non-contrast agent applications due to timing limitations. Therefore, STIR may only be used without contrast agent.

A SPAIR (Spectral Selection Attenuated Inversion Recovery) or SPIR (Spectral Presaturation Inversion Recovery) sequence provides other known fat suppression methods. These methods work in the same ways as STIR with a difference being that a NFSIR pulse is replaced by a SPAIR or a SPIR pulse. Both pulses are fat-frequency selective and spatially non-selective. The problems are similar to those of STIR, but both pulses can be used as a fat-frequency selective inversion pulse.

Other known methods that render fat dark in the image are Dixon-type methods, variable projection (VARPRO), and other estimation methods. These methods suppress fat well, but require time-consuming post-processing. A known method that uses different echo times (TE) in conjunction with an SSFP readout does not work together with GRE readout. A system according to invention principles addresses the deficiencies of known systems and the combination of IR and fat saturation.

SUMMARY OF THE INVENTION

A system provides a robust method to independently manipulate a fat and a water component of an MR signal. This system suppresses fat signal in a clinical setting using a timed manipulation of a fat T1-recovery curve that allows substantially complete fat suppression in the presence of an IR pulse, and works for different types of readout. An MR imaging system independently manipulates a fat and a water component of MR signals used for generating image data. An RF (Radio Frequency) signal generator and a magnetic field gradient generator provide an RF pulse and magnetic field gradient sequence for acquisition of an MR signal discriminating between anatomical objects based on longitudinal relaxation time (T1). The sequence comprises, a first pulse sequence for selectively inverting a water component of the MR signal substantially exclusively of fat, a first time delay adjustable to discriminate between different anatomical elements, a second pulse sequence having a resonant frequency selected to invert a fat component of the MR signal substantially exclusively of water and a data acquisition magnetic field gradient for acquisition of the MR signal. An image data processor processes an MR signal acquired to provide a display image with enhanced visualization of discriminated anatomical elements.

DETAILED DESCRIPTION OF THE INVENTION

A system employs a robust method to independently invert the magnetization of an MR water signal and an MR fat signal. The system reliably suppresses an MR fat signal in a clinical setting using a manipulation of a fat T1-recovery curve that enables substantially complete fat suppression in the presence of an RF pulse to invert MR water signal, and works for different types of readout. The system robustly and substantially completely suppresses magnetization and associated signal of fat making fat appear dark (black to dark grey) in magnetic resonance images. The fat suppression works in conjunction with T1-weighted IR imaging. The system in one embodiment, rather than using a suppression pulse (also called "saturation" pulse), uses at least one fat frequency-selective inversion pulse to suppress the fat signal. In one embodiment "fat suppression" (fat nulling) is achieved by selectively restoring the fat magnetization after prior inversion with a frequency non-selective inversion pulse, and later applying a second fat-frequency selective inversion pulse timed to acquire the image-contrast relevant data (the center of k-space) when the fat T1-recovery curve crosses the zero-magnetization line.

The system advantageously robustly nulls fat signal even in conjunction with T1-weighted IR imaging and allows for more than one inversion time and may be used in the presence of MR contrast agent. The system advantageously allows the use of a clinically optimal number of lines per segment and may be used with any type of readout including GRE, SSFP, not just TSE. A SPAIR or a SPIR pulse may be used as a fat-frequency selective inversion pulse in the disclosed system.

Figure 1:
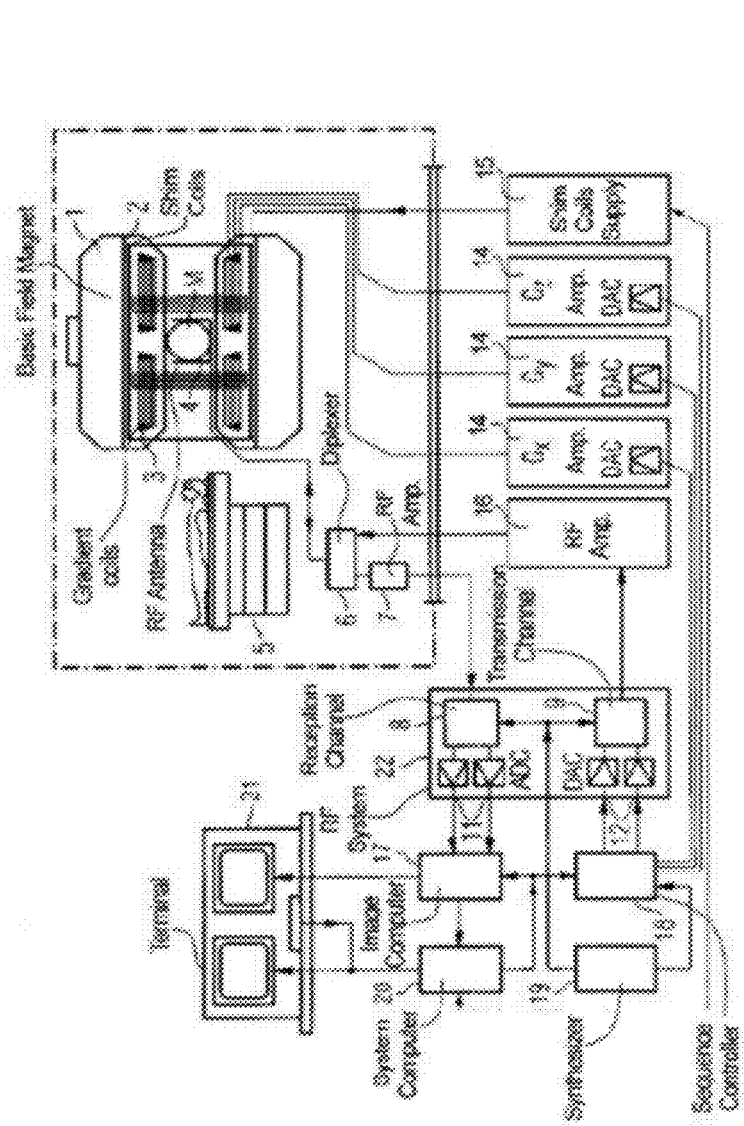
FIG. 1 shows a system for manipulating a fat component of MR signals used for generating image data in an MR imaging system, according to invention principles.

FIG. 1 is a schematic block diagram of MR imaging system 10 for independently manipulating a fat component of MR signals used for generating image data including a magnetic resonance tomography device with which MR images can be acquired according to principles of the present invention. RF coils 4 emit RF pulses to excite nuclear proton spins in measurement volume M and acquire resultant RF echo signals. The correspondingly obtained magnetic resonance signals are demodulated in receiver processing unit 8 of RF system 22 in a phase-sensitive manner, and are converted via respective analog-digital converters 11 into a real part and an imaginary part of the measurement signal and processed by imaging computer 17. Imaging computer 17 reconstructs an image from the processed acquired RF echo pulse data. The processing of RF data, the image data and the control programs is performed under control of system computer 20. In response to predetermined pulse sequence control programs, sequence controller 18 controls generation of desired pulse sequences and corresponding scanning of k-space. In particular, sequence controller 18 controls the switching of the magnetic gradients at appropriate times, transmission of RF pulses with a determined phase and amplitude and reception of magnetic resonance signals in the form of RF echo data. Synthesizer 19 determines timing of operations of RF system 22 and sequence controller 18. The selection of appropriate control programs for generating an MR image and the display of the generated nuclear spin image is performed by a user via terminal (console) 21, which contains a keyboard and one or more screens.

RF coils 4 transmit RF pulses using an RF pulse sequence and acquire an MR signal in response to transmission of the RF pulses. An RF signal generator comprises RF coils 4 and is used in generating the RF pulse sequence for discriminating between anatomical objects based on longitudinal relaxation time (T1). The RF pulse sequence includes, a water-frequency selective inversion recovery module (WFSIRM) inverting an MR signal from water substantially exclusively of fat, and a fat-frequency selective inversion recovery module (FFSIRM) inverting a fat component of the MR signal substantially exclusively of water The FFSIRM occurs with a subsequent time delay to the beginning of the data acquisition so that the fat component of the signal is substantially zero at the acquisition of the contrast-relevant portion of the data. An image data processor (imaging computer 17) processes an MR signal acquired using the RF signal generator and RF coils 4, to provide a display image with enhanced suppression of fat.

In one embodiment, RF (Radio Frequency) signal generator (RF coils 4) and a magnetic field gradient generator (gradient field system 3) provide an RF pulse and magnetic field gradient sequence for acquisition of an MR signal discriminating between anatomical objects based on longitudinal relaxation time (T1). The sequence comprises, a first pulse sequence for selectively inverting a water component of the MR signal substantially exclusively of fat, a first time delay, a second pulse sequence having a resonant frequency selected to invert a fat component of the MR signal substantially exclusively of water, a second time delay and a data acquisition magnetic field gradient for acquisition of the MR signal. An image data processor (in computer 17) processes an MR signal acquired to provide a display image with enhanced visualization of discriminated anatomical elements. The first time delay is adjustable to discriminate between different anatomical elements, and is selected to reduce an MR signal component of water to substantially zero at acquisition of the MR signal to provide T1-weighting of water and concurrently suppress a fat signal component. The second time delay follows the second pulse sequence and is prior to the data acquisition and is selected so that longitudinal magnetization of fat is substantially zero at acquisition of the MR signal to suppress a fat signal component.

In one embodiment, the WFSIRM consists of a non-selective inversion recovery (NSIR) RF pulse and a fat-frequency selective inversion (FFSIR) RF pulse, used in conjunction to re-invert the fat signal and thereby leave the fat signal component of the MR signal substantially unchanged by the combined use of the NSIR RF pulse and the FFSIR RF pulse. A timing unit (sequence controller 18) times acquisition of the MR signal following the WFSIRM to occur when a frequency component of the MR signal data associated with water is substantially zero to substantially null the water component of the signal and to capture a fat component.

Figure 2:
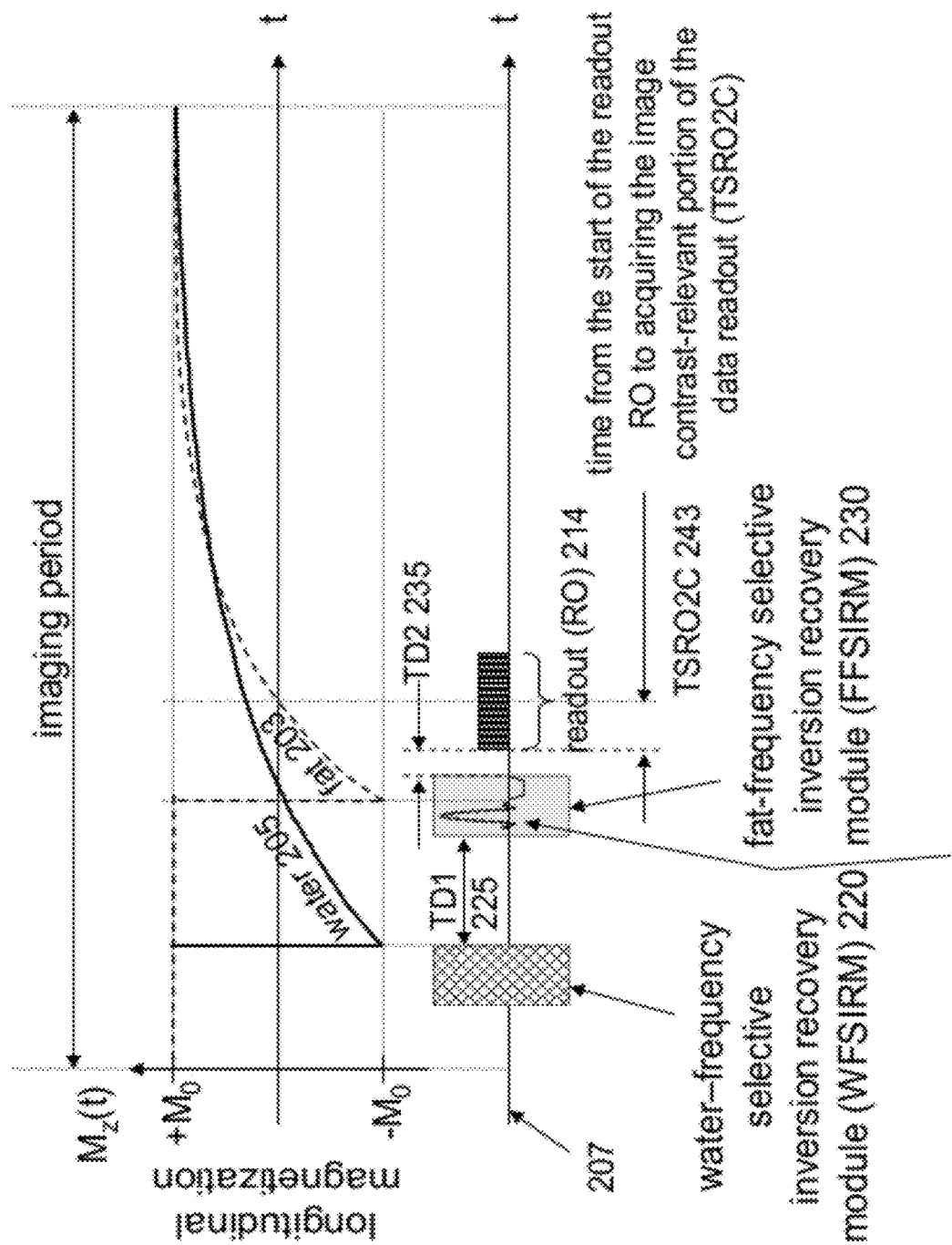
FIG. 2 shows a pulse sequence for independently manipulating a fat and a water component of a magnetic resonance signal including a water-frequency selective inversion recovery module (WFSIRM) and a fat-frequency selective inversion recovery module (FFSIRM), according to invention principles.

FIG. 2 shows a pulse sequence 207 provided by system 10 (FIG. 1) including a water-frequency selective inversion recovery module (WFSIRM) 220 and a fat-frequency selective inversion recovery module (FFSIRM) 230. Curve 203 depicts an MR derived fat signal component and curve 205 depicts an MR derived water signal component. System 10 advantageously provides for independent manipulation of the water MR signal component by module WFSIRM 220 and the fat MR signal component by module FFSIRM 230, allowing for T1-weighted MR images with scalable ratio of water and fat component. A time delay TD1 225 is inserted between WFSIRM 220 and FFSIRM 230. A time delay TD2 235 is inserted between FFSIRM 230 and start of the data readout (RO) 214. TD2 is adjusted to force the T1-specific component of fat 203 to be substantially zero at the image-contrast relevant portion of the data readout 214, which occurs TSRO2C 243 after the beginning of the readout 214, advantageously providing fat saturation. For given TD2 235 and given duration of module FFSIRM 230, TD1 225 is adjusted to force the T1-specific component of water 205 to be substantially zero at the image-contrast relevant portion of the data readout 214. Thus pulse sequence 207 provided by system 10 advantageously comprises a fat-suppressed and/or water-suppressed T1-weighted imaging sequence.

Figure 3:
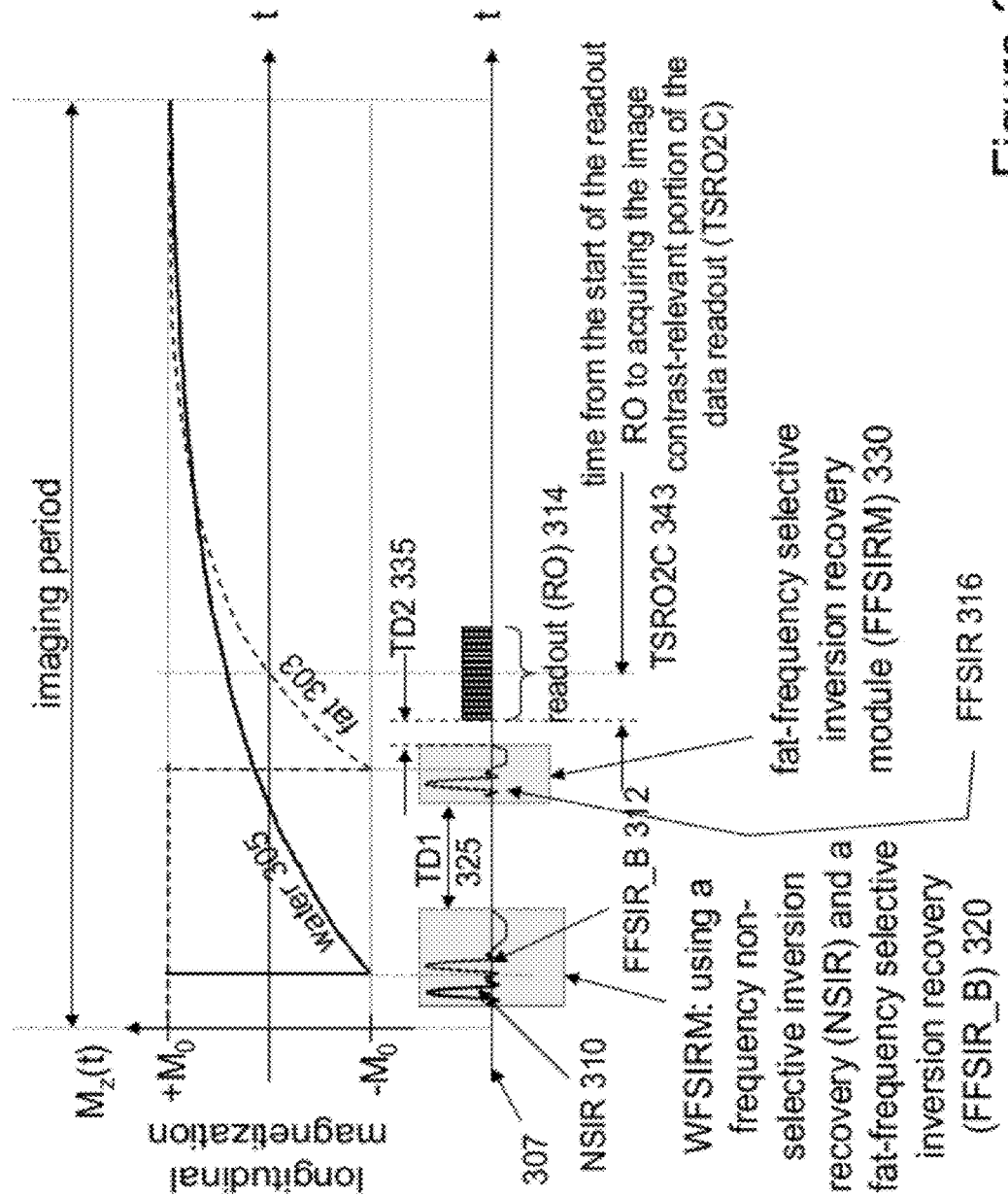
FIG. 3 shows a frequency non-selective inversion recovery (NSIR) and a fat-frequency selective inversion recovery (FFSIR_B) RF pulses used as a water-frequency selective inversion recovery module, according to invention principles.

FIG. 3 shows pulse sequence 307 including water-frequency selective inversion module WFSIRM 320 provided by system 10 (FIG. 1) including a non-selective inversion (NSIR) pulse 310 and a fat-frequency selective inversion recovery (FFSIR_B) pulse 312. NSIR pulse 310 inverts both the water and the fat MR signal component, and the fat-frequency selective RF pulse FFSIR_B 312 re-inverts only the fat component. The combined use of the NSIR and the FFSIR RF pulses advantageously leaves the fat signal component of the MR signal substantially unchanged while providing T1-weighted inversion recovery imaging through the NSIR pulse. A second fat-frequency selective inversion recovery RF pulse WFSIR 316 included in a fat-frequency selective inversion recovery module (FFSIRM) 330 selectively inverts the fat MR signal component to affect fat magnetization independently of water.

Figure 4:
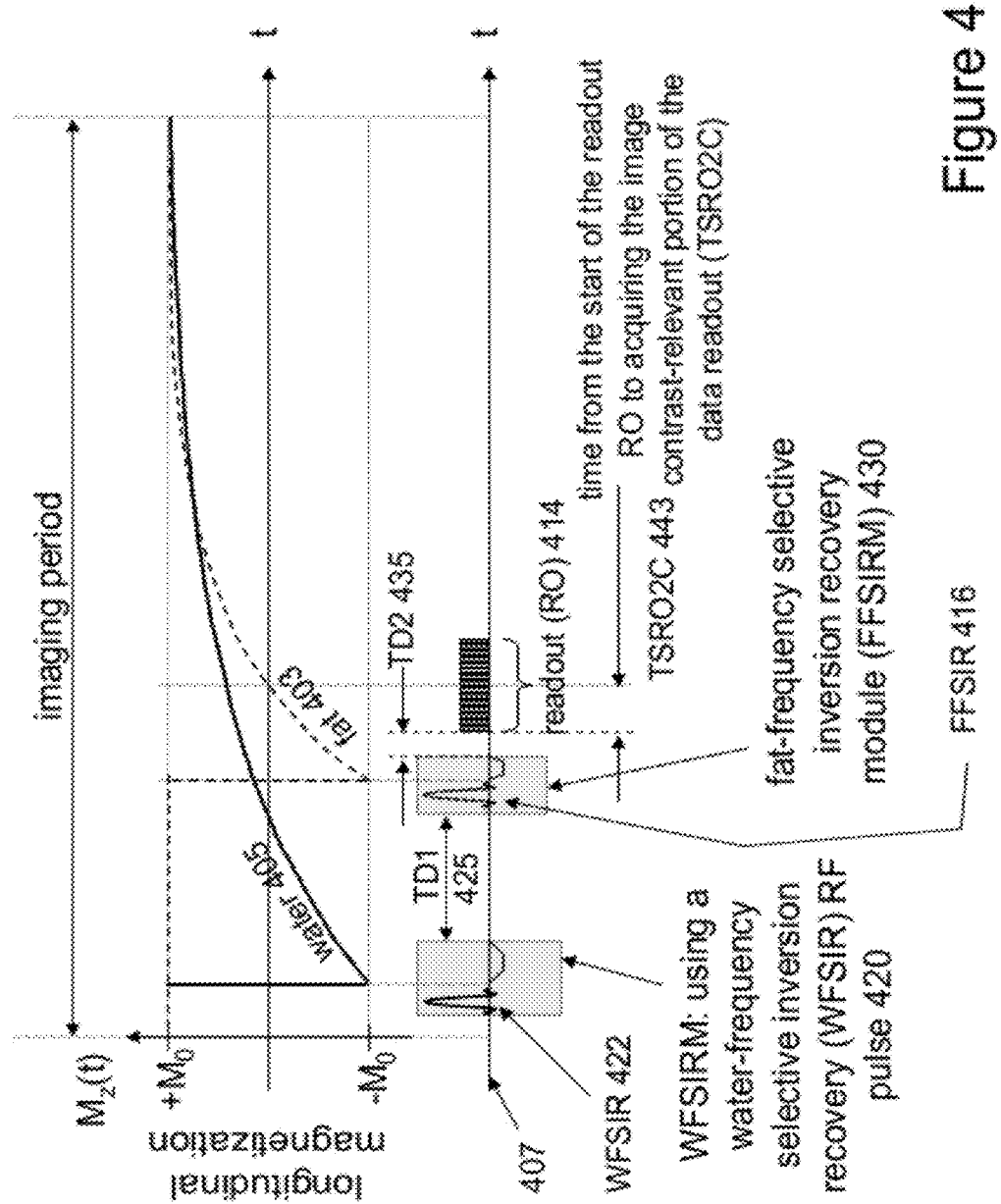
FIG. 4 shows a water frequency selective inversion recovery (WFSIR) RF pulse as water frequency selective inversion recovery module, according to invention principles.

FIG. 4 shows pulse sequence 407 including water-frequency selective inversion module WFSIRM 420 of pulse sequence 407 provided by system 10 (FIG. 1) includes a water-frequency selective inversion pulse WFSIR 422. The WFSIR 422 pulse advantageously leaves the fat signal component of the MR signal substantially unchanged while providing T1-weighted inversion recovery imaging of the water components of the imaged subject. Using the WFSIR 422 pulse, the WFSIRM 420 advantageously applies less energy to the imaged subject than the WFSIRM module 320 (FIG. 3) resulting in a smaller specific absorption rate SAR. A second fat-frequency selective inversion recovery RF pulse WFSIR 416 included in a fat-frequency selective inversion recovery module (FFSIRM) 430 selectively inverts the fat MR signal component to affect fat magnetization independently of water.

Figure 5:
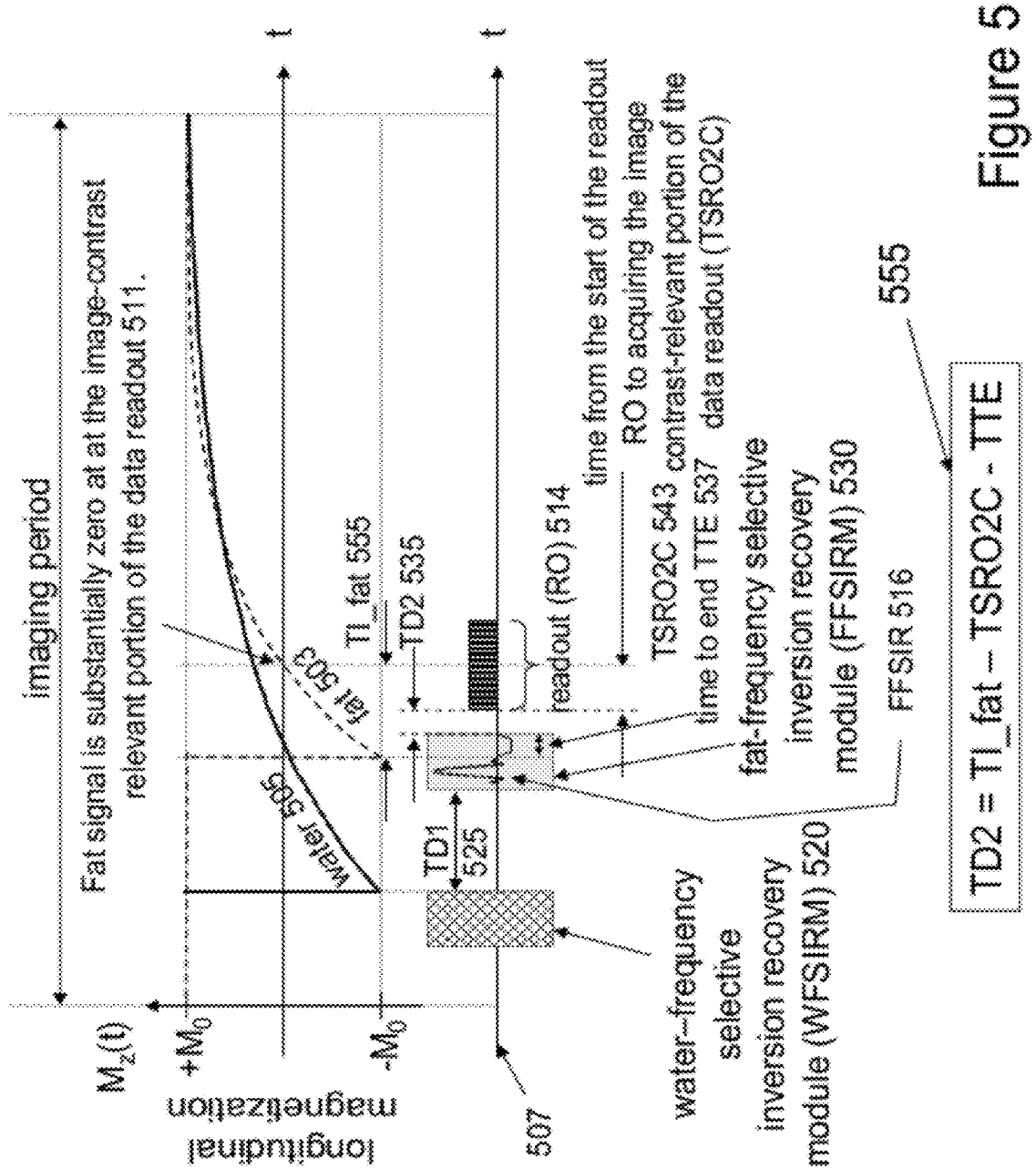
FIG. 5 shows time delay selection to manipulate longitudinal magnetization of fat so that it is substantially zero at time of image data acquisition to suppress the fat signal component, according to invention principles.

FIG. 5 shows pulse sequence 507 including time delay TD2 535 provided by system 10 (FIG. 1) that is selected to reduce the T1-specific component of fat 503 to substantially zero at the image-contrast relevant portion 511 of the data readout 514. TD2 535 is determined by adding the time TTE 537 (time from the end of the FFSIR 516 RF pulse to the end of the module FFSIRM 530) and the time TSRO2C 543 (the time from the start of the readout RO to acquiring the image contrast-relevant portion of the data readout) and then subtracting this sum from the inversion time of fat TI_fat 555:

$$TD2 = TI\_fat - TSRO2C - TTE \quad \text{(formula 555)}$$

The system thereby advantageously suppresses the fat signal component of the MR signal while concurrently and independently providing T1-weighting of water by the water-frequency selective inversion recovery module (WFSIRM) 520.

Figure 6:
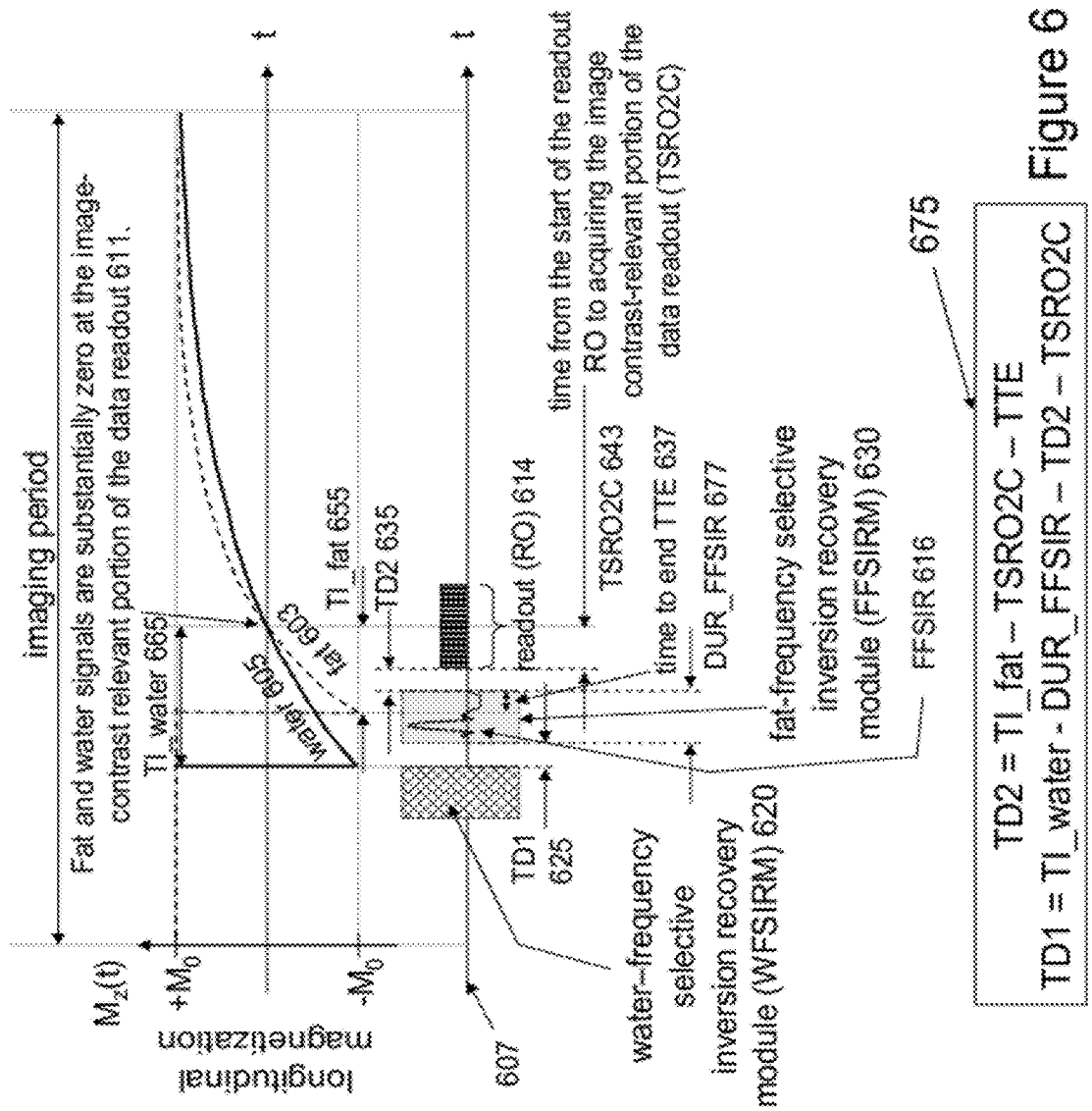
FIG. 6 shows selection of time delays to concurrently reduce a T1-specific component of water and a T1-specific component of fat to substantially zero to provide T1-weighting of water while concurrently suppressing signal from fat, according to invention principles.

FIG. 6 shows pulse sequence 607 including time delay TD2 635 provided by system 10 (FIG. 1) that is selected to reduce the T1-specific component of fat 603 to substantially zero at the image-contrast relevant portion 611 of the data readout 614, while concurrently selecting TD1 625 to force the T1-specific component of water 605 to be substantially zero at the same image-contrast relevant portion 611 of the data readout 614. TD2 635 is determined by adding the time TTE 637 (time from the end of the FFSIR 616 RF pulse to the end of the module FFSIRM 630) and the time TSRO2C 643 (the time from the start of the readout RO to acquiring the image contrast-relevant portion of the data readout) and then subtracting this sum from the inversion time of fat TI_fat 655:

$$TD2 = TI\_fat - TSRO2C - TTE \quad \text{(formula 655)}$$

TD1 625 is determined by adding the duration of the module FFSIRM 630 DUR_FFSIR 677, the time delay TD2 635, and the time from the start of the readout RO to acquiring the image contrast-relevant portion of the data readout TSRO2C 643 and subtracting this sum from the inversion time of water TI_water 665:

$$TD1 = TI\_water - DUR\_FFSIR - TD2 - TSRO2C \quad \text{(formula 675)}$$

The system thereby advantageously suppresses a fat signal component of the MR signal while concurrently and independently nulling a water signal of a given T1-species, thereby providing T1-weighting of water by the water-frequency selective inversion recovery module (WFSIRM) 620 while concurrently suppressing fat signal.

Figure 7:
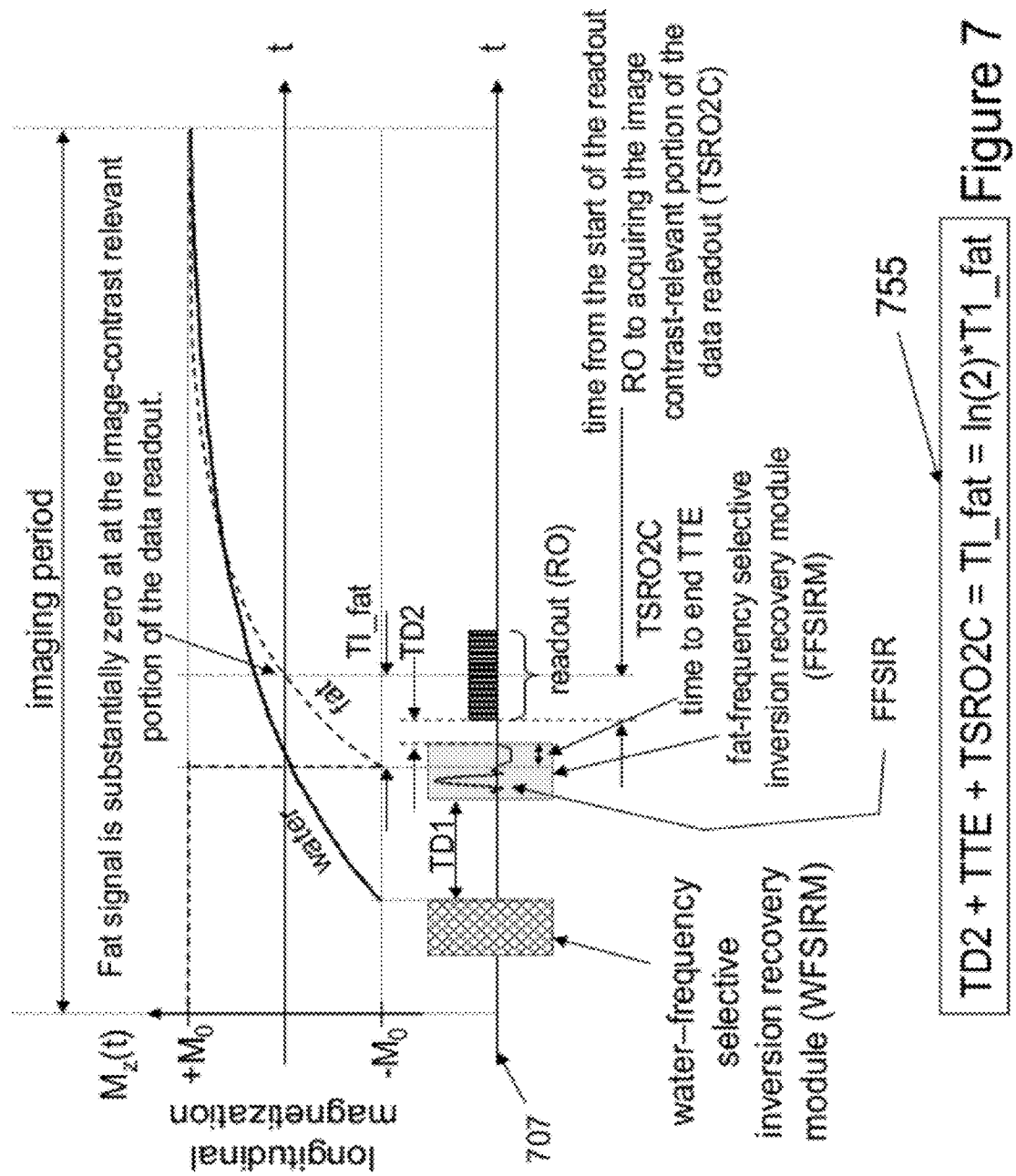
FIG. 7 shows time delay from the beginning of data readout to acquiring an image-contrast relevant portion of the data, according to invention principles

FIG. 7 shows pulse sequence 707 wherein TI_fat 755 is set equal to T1 of fat times the natural logarithm of 2:

TD2+*TTE*+*TSRO2*C=TI_fat=ln(2)**T*1fat (formula 755)

Figure 8:
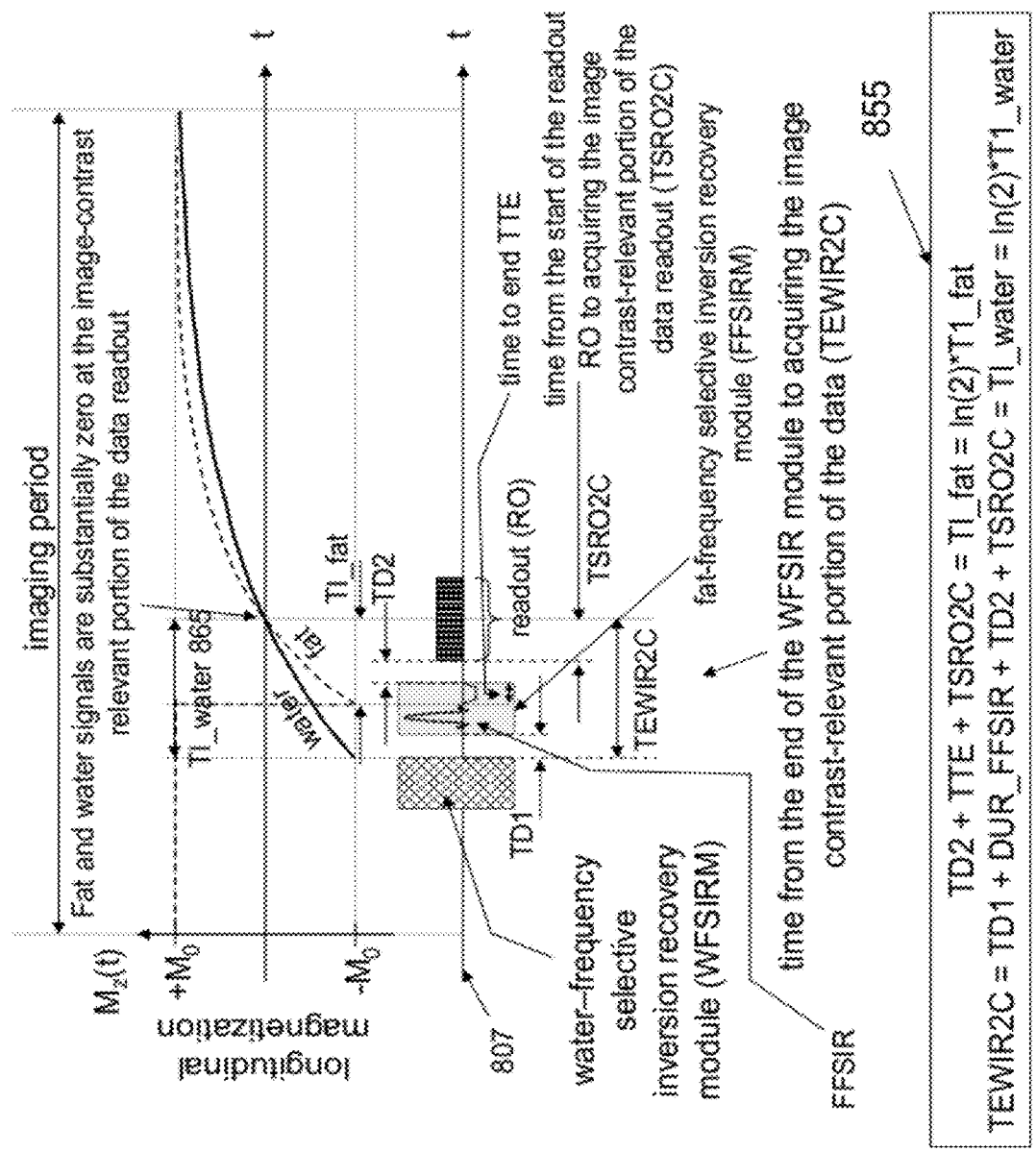
FIG. 8 shows a time delay that substantially equals the inversion time of the fat component, according to invention principles.

FIG. 8 shows pulse sequence 807 (wherein TI_fat 855 is set equal to T1 of fat times the natural logarithm of 2:

TD2+*TTE*+*TSRO2*C=TI_fat=ln(2)**T*1fat (formula 855), and TI_water 865 is set equal to T1 of water times the natural logarithm of 2:

TD1+DUR_FFSIR+TD2+*TSRO2C*=TI_water=ln(2)**T*1_water (formula 855).

Figure 9:
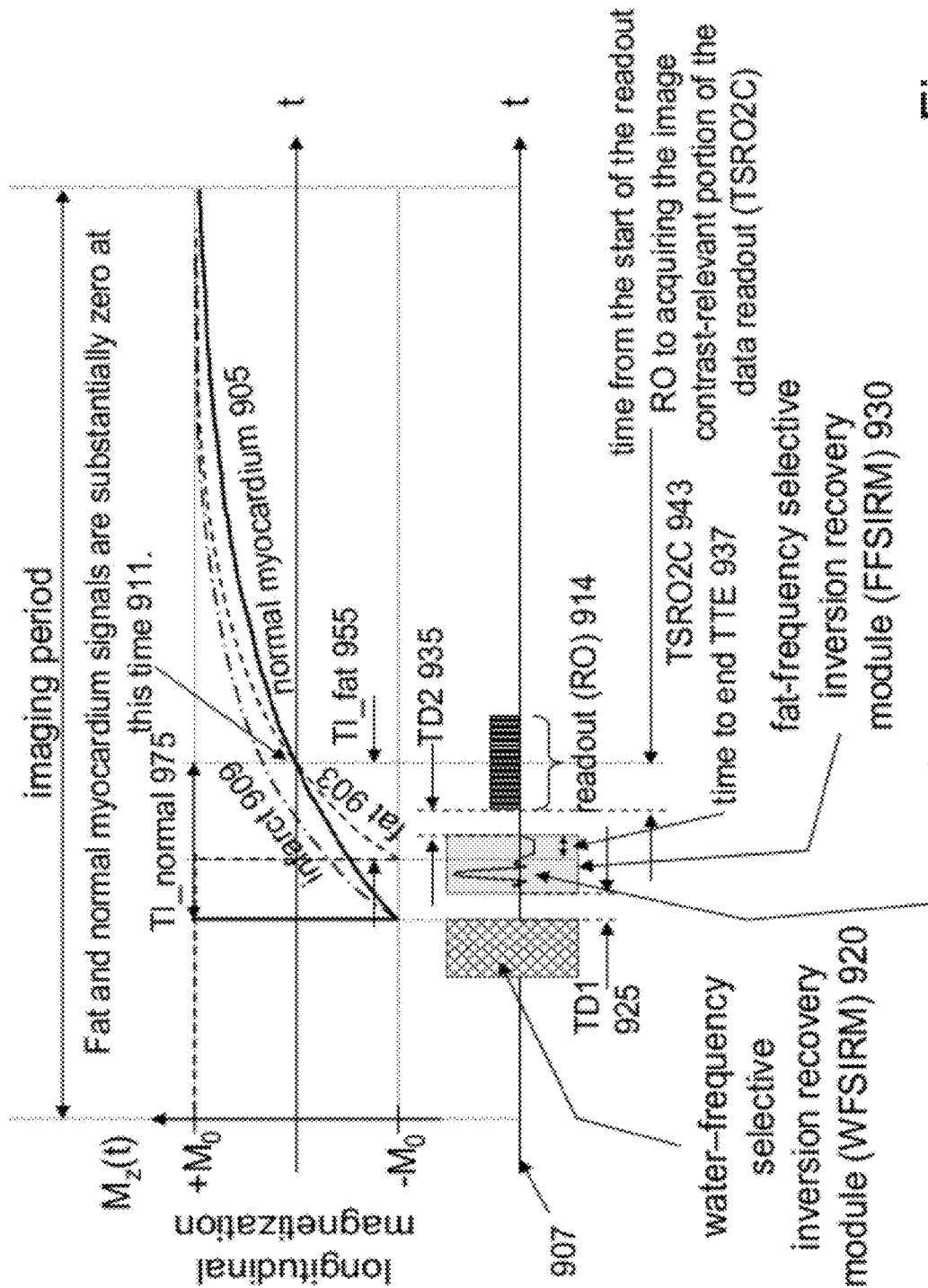
FIG. 9 shows fat-suppressed delayed enhancement imaging according to invention principles.

FIG. 9 shows a fat suppression pulse sequence 907 including a water-frequency selective inversion recovery module (WFSIRM) 920 and fat-frequency selective inversion recovery module FFSIRM 930 in a delayed enhancement embodiment. Curve 903 depicts an MR derived fat signal component, curve 905 depicts an MR derived normal myocardium signal component and curve 909 depicts an MR derived infarcted myocardium signal component. Non-selective inversion, of water is achieved by a water-frequency selective inversion recovery module (WFSIRM) 920. Magnetic inversion of tissue and data readout (RO) 914 are components of a T1-weighted inversion recovery (IR) pulse sequence, for example an IR TurboFlash sequence. System 10 advantageously provides fat saturation in the presence of T1-weighted inversion recovery imaging by inverting fat signal with a fat-frequency selective inversion recovery module (FFSIRM) 930 and by using a time delay TD2 935 to reduce the MR derived fat signal component curve 905 to zero at the image contrast-relevant portion of the data readout.

Figure 10:
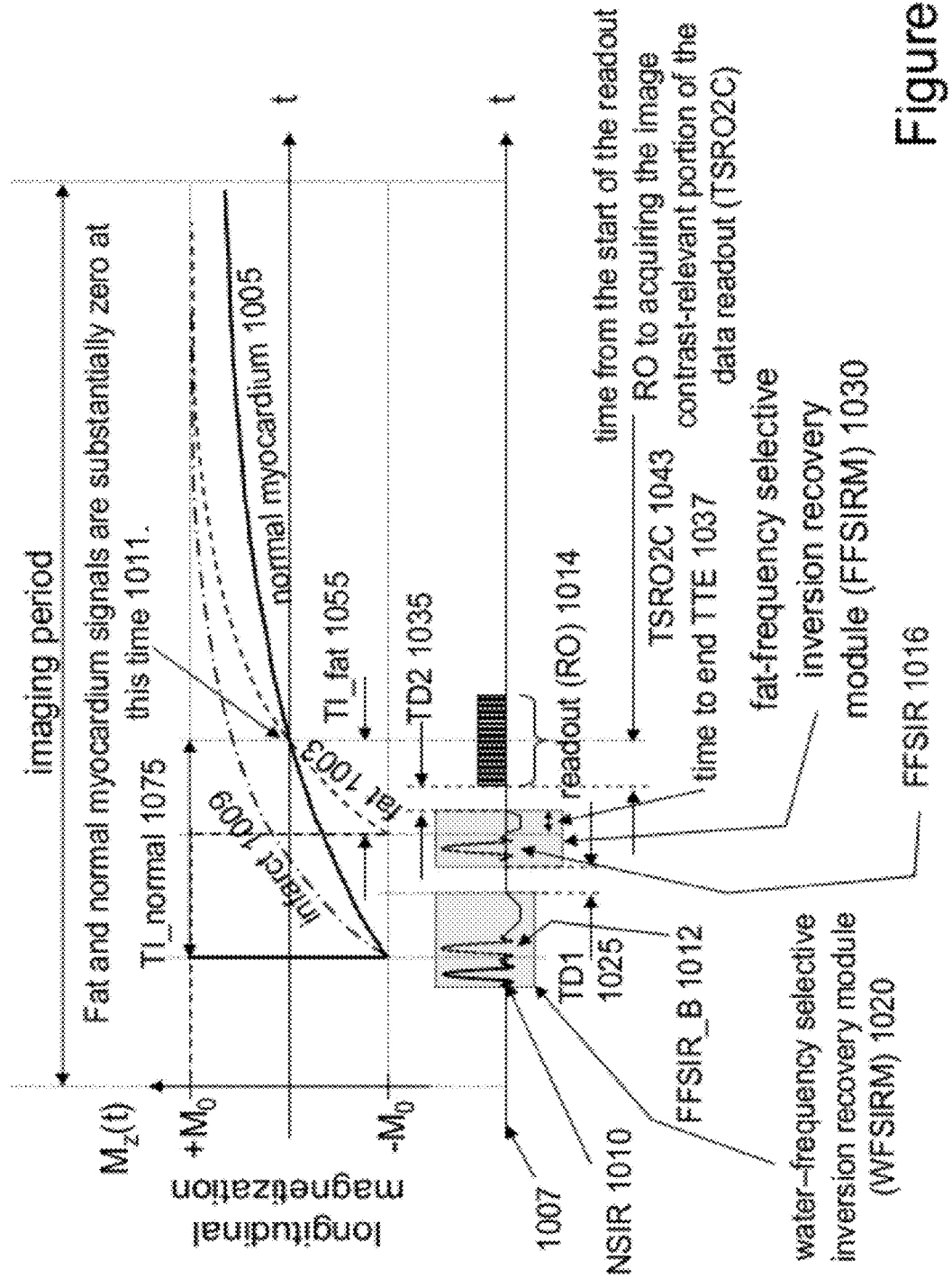
FIG. 10 shows fat-suppressed delayed enhancement imaging that employs a non-chemically selective inversion recovery pulse and two fat-frequency selective inversion recovery pulses, according to invention principles.

FIG. 10 shows a fat suppression pulse sequence 1007 including a non-selective inversion (NSIR) pulse 1010 and two fat-frequency selective inversion recovery pulses FFSIR_B 1012, FFSIR 1016 in a delayed enhancement embodiment. Curve 1003 depicts an MR derived fat signal component, curve 1005 depicts an MR derived normal myocardium signal component and curve 1009 depicts an MR derived infarcted myocardium signal component. Non-selective inversion (NSIR) pulse 1010 and data readout (RO) 1014 are components of a T1-weighted inversion recovery (IR) pulse sequence, for example an IR TurboFlash sequence. System 10 advantageously provides fat saturation in the presence of T1-weighted inversion recovery imaging and inverts fat signal before or after a non-fat frequency selective inversion recovery pulse using a water-frequency selective inversion recovery module (WFSIRM) 1020 (i.e., FFSIR_B pulse 1012 combined with NSIR pulse 1010 to leave fat magnetization effectively untouched) followed by the fat-frequency selective inversion recovery module FFSIRM 1030 (i.e., FFSIR pulse 1016 to invert fat magnetization).

System 10 (FIG. 1) advantageously combines NSIR pulse 1010 with the consecutive sequential FFSIR_B pulses 1012, 1016 to leave the fat magnetization 1003 effectively "untouched" as FSSIR_B pulse 1012 reinverts and thereby restores fat magnetization that was inverted by the leading NSIR pulse 1010. Second FSSIR pulse 1016 selectively inverts fat without affecting the recovery of normal myocardium 1005 and infarcted myocardium 1009. From fully relaxed status prior to FSSIR pulse 1016 the inversion time to null fat signal 1003, $TI_{fat}$, is a maximal 160 ms at 1.5 T and 200 ms at 3 T, respectively. Thus, even for long readout pulse sequences up to 320 ms and 400 ms respectively, fat signal 1003 is reliably suppressed with pulse sequence 1007. The inversion time of water $TI_{water}=\ln(T_{1water})$ and the inversion time of fat $TI_{fat}=\ln(T_{1fat})$. The pulse sequence renders the healthy myocardium 1005 dark (ideally dark gray, but often black), and infarcted myocardium 1009 is bright. The black fat 1003 is provided using a SPAIR pulse sequence, for example, and is shown in addition to the image contrast of dark normal and bright infarcted myocardium so not all water is nulled, only that in the normal myocardium 1005.

The combination of NSIR pulse 1010 and FFSIR pulses 1012 and 1016 advantageously provides reliable fat signal suppression and enables fat signal suppression with the longest possible effective fat inversion time ($TI_{fat}$) and it makes the optimal inversion time of fat $TI_{fat}$ independent of the inversion time required to null viable myocardium ($TI_{myocardium}$). The system advantageously enables longer readout trains and a simplified timing calculation.

In another embodiment, the combination of NSIR pulse 1010 and FFSIR_B pulse 1012 is replaced with a water-selective inversion pulse that does not affect fat. This reduces the RF energy with which the patient is irradiated. In a further embodiment, the combination of NSIR 1010 and FFSIR_B 1012 pulses is played by itself, without the second later played FFSIRM as a preparation module (pulse sequence) that does not affect fat, but inverts the signal from remaining anatomy. The system is independent of the implementation of the fat-frequency selective inversion recovery pulse and may use a SPAIR or SPIR pulse. Further, FFSIR_B 1012 can be played before rather than after the NSIR pulse without affecting the function of the system. The system provides a robust "fat suppression" method for contrast enhanced delayed image enhancement and improves fat suppression for coronary MRA (magnetic resonance angiography) with and without the use of contrast agent. The system is applicable to a variety of different MRI methods to suppress fat, not just in cardiac MRI and may be used together with GRE, SSFP, and TSE readout. The system in one embodiment combines the WFSIRM module with a dark blood preparation scheme and uses an FFSIR_B pulse 1012 to null fat at the same time that blood is nulled. This is analogous to STIR TSE or TSE with SPAIR and delivers substantially the same image contrast, but in the system the inversion time to null fat is independent of the heart rate or the effective TR, whereas in the known STIR TSE method, it is not. This advantageously simplifies the timing calculation of $TI_{fat}$. The system is used together with a phase-sensitive imaging method such as phase-sensitive inversion recovery (PSIR) and with PSIR, but with a short inversion time so that fat has negative signal during readout. Fat is then the most negative species and is thus depicted black in the PSIR image. This leads to an even darker and more homogeneous depiction of fat than using the system without PSIR. The system can be used without or in combination with delayed enhancement.

Figure 11:
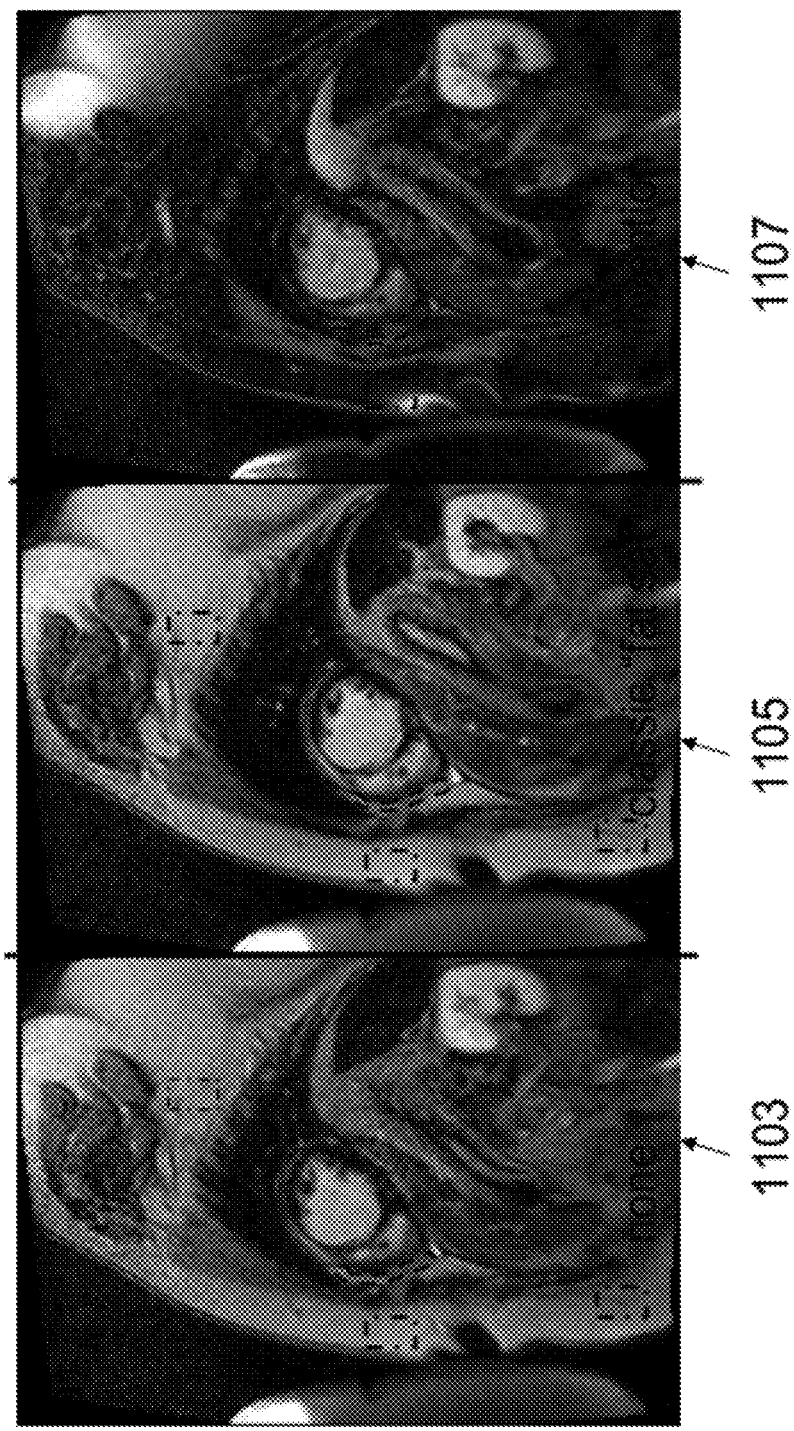
FIG. 11 shows delayed enhancement MR images of a patient acquired at 1.5 T (Tesla) a) with no fat suppression, b) with known classic fat saturation suppression and c) with fat suppression according to invention principles.

FIG. 11 shows MR images of a patient acquired at 1.5 T (Tesla). Image 1103 shows an image with no fat suppression, image 1105 show the corresponding same image using known classic fat saturation suppression and image 1107 shows the corresponding same image with fat suppression provided by system 10 (FIG. 1). The white dashed regions of interest are drawn on epicardial and subcutaneous fat and indicate the fat signal of image 1105 is hardly suppressed at all by the known fat suppression method relative to image 1103 having no fat suppression. In contrast image 1107 shows fat is substantially completely suppressed by system 10.

Figure 12:
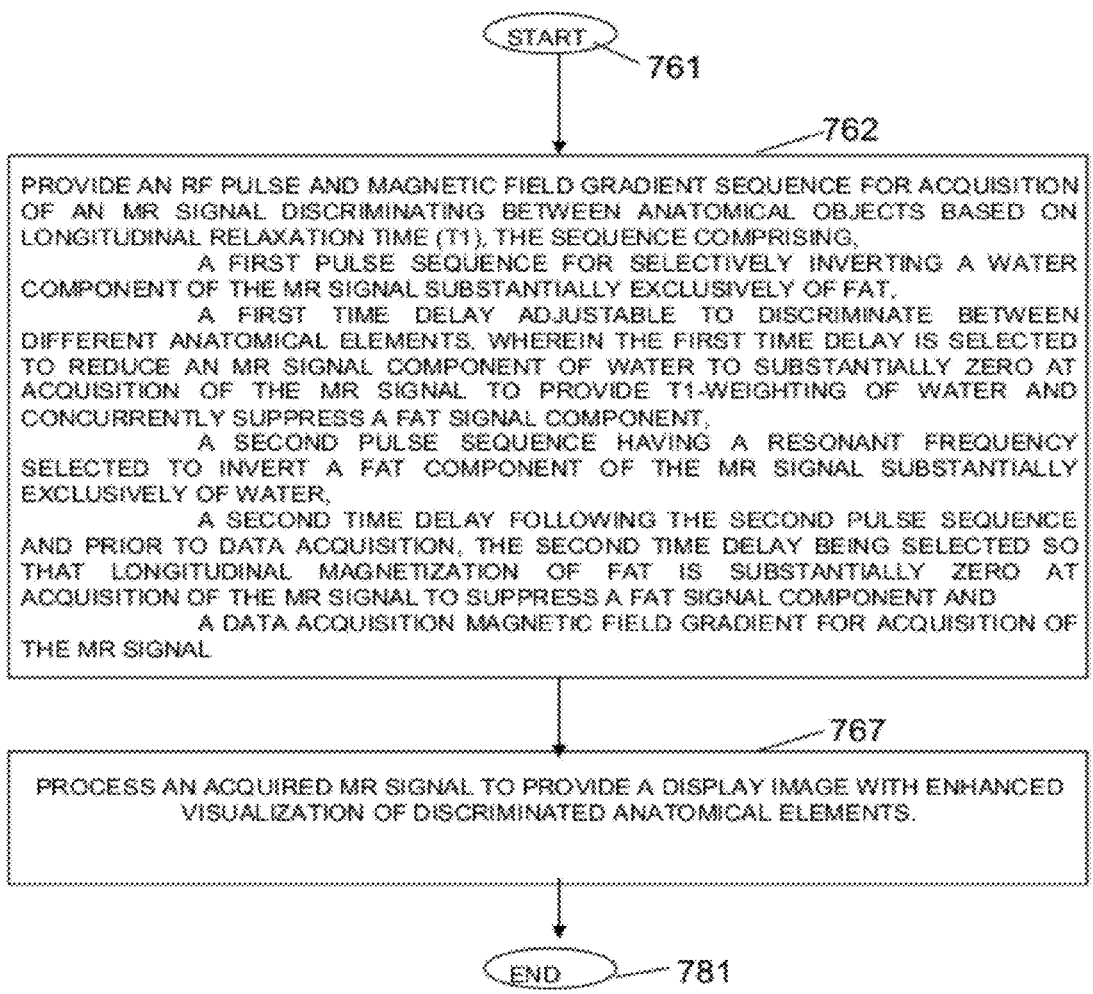
FIG. 12 shows a flowchart of a process performed by a system for manipulating a fat component of MR signals used for generating image data in an MR imaging system, according to invention principles.

FIG. 12 shows a flowchart of a process performed by system 10 for manipulating a fat component of MR signals used for generating image data in an MR imaging system. In step 762 following the start at step 761, an RF (Radio Frequency) signal generator and a magnetic field gradient generator provide an RF pulse and magnetic field gradient sequence for acquisition of an MR signal discriminating between anatomical objects based on longitudinal relaxation time (T1). The RF (Radio Frequency) signal generator generates RF excitation pulses in an anatomical region of interest and enables subsequent acquisition of associated RF echo data and the magnetic field gradient generator generates magnetic field gradients for phase encoding and readout RF data acquisition. The RF pulse and magnetic field gradient sequence provides fat-suppressed delayed enhancement imaging. The sequence in one embodiment comprises, a first pulse sequence for selectively inverting a water component of the MR signal substantially exclusively of fat, a first time delay, a second pulse sequence having a resonant frequency selected to invert a fat component of the MR signal substantially exclusively of water, a second time delay and a data acquisition magnetic field gradient for acquisition of the MR signal. The MR signal is acquired using at least one of, (a) gradient echoes, (b) spin echoes, (c) steady-state free precession, (d) a segmented data acquisition and (e) acquisition of MR signals as single shots.

The first time delay is adjustable to discriminate between different anatomical elements and is selected to reduce an MR signal component of water to substantially zero at acquisition of the MR signal to provide T1-weighting of water and concurrently suppress a fat signal component. Further, in one embodiment, the first time delay is selected to provide T1-weighting of water while concurrently depicting fat dark in a PSIR image and to reduce the longitudinal magnetization of water to substantially zero at time of the data acquisition to provide T1-weighting of water while concurrently depicting fat dark in a phase sensitive image reconstruction (PSIR) image.

The second time delay follows the second pulse sequence and is prior to the data acquisition and is selected so that longitudinal magnetization of fat is substantially zero or negative at acquisition of the MR signal to suppress a fat signal component and to depict fat dark in a PSIR image. The second time delay plus a time from the beginning of the data acquisition substantially equals an inversion time of a fat component and a time from end of water selective inversion to the data acquisition substantially equals an inversion time of a water component. The inversion time of the water component is a function of at least two of, static magnetic field strength, dose of contrast agent injected, time elapsed after the injection, patient physiology and an imaging acquisition duration.

The first pulse sequence includes a frequency non-selective inversion recovery RF pulse inverting an MR signal from both water and fat, and a fat selective inversion recovery RF pulse having a resonant frequency selected to invert a fat component of the MR signal substantially exclusively of water. The fat selective inversion recovery RF pulse substantially immediately precedes or follows the non-selective inversion recovery RF pulse leaving a fat signal component of the MR signal substantially unchanged. In one embodiment, the first pulse sequence includes a water selective inversion recovery RF pulse. In step 767 in one embodiment, an image data processor processes the acquired MR signal to provide a phase sensitive image reconstruction (PSIR) and to provide a display image with enhanced visualization of discriminated anatomical elements. The image data processor processes the MR signal using a reference data set to provide a PSIR image. The process of FIG. 12 terminates at step 781.

The RF pulse sequence includes, a non-selective inversion recovery RF pulse inverting an MR signal from both water and fat and a fat-selective inversion RF pulse having a resonant frequency selected to invert a fat component of the MR signal substantially exclusively of water. The fat selective inversion RF pulse follows the non-selective inversion recovery RF pulse within a time period of a multiple of five times the longitudinal relaxation time of the fat component. The non-selective inversion recovery RF pulse and the fat-selective inversion RF pulse are used in conjunction to re-invert the fat signal and thereby leave the fat signal component of the MR signal substantially unchanged by the combined use of the non-selective inversion recovery RF pulse and the fat-selective inversion RF pulse.

The RF pulse sequence includes, a second fat-frequency selective inversion module, such as a fat-selective inversion RF pulse, having a resonant frequency selected to invert the fat component of an MR signal substantially exclusively of water. The second fat-selective inversion occurs with a subsequent time delay to the beginning of the data acquisition so that the fat component of the signal is substantially zero at the acquisition of the contrast-relevant portion of the data. The subsequent time delay is substantially derived in response to a natural logarithm of the longitudinal recovery time of a fat component $T1_{fat}$ and is used for fat-suppressed delayed enhancement imaging.

The RF signal generator and RF coils 4 in MR imaging system 10 acquire the MR signal using at least one of, gradient echoes, spin echoes, and steady-state free precession pulse sequences. In one embodiment, the RF signal generator and RF coils 4 in MR imaging system 10 acquire the MR signal coils in single shots or using segmented data acquisition.

A timing unit (sequence controller 18) in step 617 times acquisition of the MR signal following the fat selective inversion RF pulse to occur when a frequency component of the MR signal data associated with water is substantially zero to substantially null the water component of the signal and to capture a fat component. The timing unit times duration from the fat selective inversion RF pulse to acquisition of the MR signal in response to the inversion time of the water component $TI_{water}$ of from the signal and the time from the end of the non-selective inversion recovery pulse, to the end of a pulse sequence module including the non-selective inversion recovery RF pulse. The inversion time of the water component $TI_{water}$ substantially comprises a natural logarithm of the longitudinal recovery time of the water component $T1_{water}$ and is a function of at least two of, static magnetic field strength, dose of contrast agent injected, time elapsed after the injection, patient physiology, and an imaging acquisition duration. The inversion time of the water component $TI_{water}$ also substantially comprises a natural logarithm of the longitudinal recovery time of the water component $T1_{water}$ and is a function of the static magnetic field strength and an imaging acquisition duration. The timing unit times acquisition of the MR signal to occur following the fat selective inversion RF pulse in response to the inversion time TI of the water component of the signal. The timing unit times acquisition of a contrast agent relevant portion of the MR signal to occur at a time substantially comprising a duration TI of the water component from the NSIR pulse. In step 619, a processing system (imaging computer 17) processes an MR signal acquired using the RF signal generator and RF coils 4, to provide a display image with enhanced visualization of fat. The process of FIG. 6 terminates at step 631.

Continuing with operation of system 10 (FIG. 1), basic field magnet 1 generates a strong magnetic field, which is constant in time, for the polarization or alignment of the nuclear spins in the examination region of an object, such as, for example, a part of a human body to be examined. The high homogeneity of the basic magnetic field required for the magnetic resonance measurement is provided in a spherical measurement volume M, for example, into which the parts of the human body to be examined are brought. In order to satisfy the homogeneity requirements and especially for the elimination of time-invariant influences, shim-plates made of ferromagnetic material are mounted at suitable positions. Time-variable influences are eliminated by shim coils 2, which are controlled by a shim-current supply 15.

In the basic magnetic field 1, a cylinder-shaped gradient coil system 3 is used, which consists of three windings, for example. Each winding is supplied with current by an amplifier 14 in order to generate a linear gradient field in the respective directions of the Cartesian coordinate system. The first winding of the gradient field system 3 generates a gradient $G_x$ in the x-direction, the second winding generates a gradient $G_y$ in the y-direction, and the third winding generates a gradient $G_z$ in the z-direction. Each amplifier 14 contains a digital-analog converter, which is controlled by a sequence controller 18 for the generation of gradient pulses at proper times.

Within the gradient field system 3, radio-frequency (RF) coils 4 are located which converts the radio-frequency pulses emitted by a radio-frequency power amplifier 16 via multiplexer 6 into a magnetic alternating field in order to excite the nuclei and align the nuclear spins of the object to be examined or the region of the object to be examined. In one embodiment, RF coils 4 comprise a subset or substantially all of, multiple RF coils arranged in sections along the length of volume M corresponding to the length of a patient. Further, an individual section RF coil of coils 4 comprises multiple RF coils providing RF image data that is used in parallel to generate a single MR image. RF pulse signals are applied to RF coils 4, which in response produces magnetic field pulses which rotate the spins of the protons in the imaged body by ninety degrees or by one hundred and eighty degrees for so-called "spin echo" imaging, or by angles less than or equal to 90 degrees for so-called "gradient echo" imaging. In response to the applied RF pulse signals, RF coils 4 receive MR signals, i.e., signals from the excited protons within the body as they return to an equilibrium position established by the static and gradient magnetic fields. The MR signals comprising nuclear spin echo signals received by RF coils 4 as an alternating field resulting from the precessing nuclear spins, are converted into a voltage that is supplied via an amplifier 7 and multiplexer 6 to a radio-frequency receiver processing unit 8 of a radio-frequency system 22.

The radio-frequency system 22 operates in an RF signal transmission mode to excite protons and in a receiving mode to process resulting RF echo signals. In transmission mode, system 22 transmits RF pulses via transmission channel 9 to initiate nuclear magnetic resonance in volume M. Specifically, system 22 processes respective RF echo pulses associated with a pulse sequence used by system computer 20 in conjunction with sequence controller 18 to provide a digitally represented numerical sequence of complex numbers. This numerical sequence is supplied as real and imaginary parts via digital-analog converter 12 in the high-frequency system 22 and from there to a transmission channel 9. In the transmission channel 9, the pulse sequences are modulated with a radio-frequency carrier signal, having a base frequency corresponding to the resonance frequency of the nuclear spins in the measurement volume M. The conversion from transmitting to receiving operation is done via a multiplexer 6. System computer 20 automatically (or in response to user command entered via terminal 21) determines pulse sequence timing parameters for MR imaging with fat signal suppression.

A processor as used herein is a device for executing machine-readable instructions stored on a computer readable medium, for performing tasks and may comprise any one or combination of, hardware and firmware. A processor may also comprise memory storing machine-readable instructions executable for performing tasks. A processor acts upon information by manipulating, analyzing, modifying, converting or transmitting information for use by an executable procedure or an information device, and/or by routing the information to an output device. A processor may use or comprise the capabilities of a computer, controller or microprocessor, for example, and is conditioned using executable instructions to perform special purpose functions not performed by a general purpose computer. A processor may be coupled (electrically and/or as comprising executable components) with any other processor enabling interaction and/or communication therebetween. A user interface processor or generator is a known element comprising electronic circuitry or software or a combination of both for generating display images or portions thereof. A user interface comprises one or more display images enabling user interaction with a processor or other device.

An executable application, as used herein, comprises code or machine readable instructions for conditioning the processor to implement predetermined functions, such as those of an operating system, a context data acquisition system or other information processing system, for example, in response to user command or input. An executable procedure is a segment of code or machine readable instruction, sub-routine, or other distinct section of code or portion of an executable application for performing one or more particular processes. These processes may include receiving input data and/or parameters, performing operations on received input data and/or performing functions in response to received input parameters, and providing resulting output data and/or parameters. A user interface (UI), as used herein, comprises one or more display images, generated by a user interface processor and enabling user interaction with a processor or other device and associated data acquisition and processing functions.

The UI also includes an executable procedure or executable application. The executable procedure or executable application conditions the user interface processor to generate signals representing the UI display images. These signals are supplied to a display device which displays the image for viewing by the user. The executable procedure or executable application further receives signals from user input devices, such as a keyboard, mouth, light pen, touch screen or any other means allowing a user to provide data to a processor. The processor, under control of an executable procedure or executable application, manipulates the UI display images in response to signals received from the input devices. In this way, the user interacts with the display image using the input devices, enabling user interaction with the processor or other device. The functions and process steps herein may be performed automatically or wholly or partially in response to user command. An activity (including a step) performed automatically is performed in response to executable instruction or device operation without user direct initiation of the activity.

DEFINITIONS

An inversion recovery (IR) pulse inverts longitudinal magnetization from the positive z-axis by 180 degrees to the negative z-axis. IR pulses are used as preparation pulses prior to a main imaging pulse sequence to achieve different kinds of MR contrast (such as T1 weighted, T2 weighted).

TI=inversion time, the time between an inversion recovery pulse and the next RF excitation pulse. TI determines the image contrast.

$T_1$=the longitudinal (or spin-lattice) relaxation time $T_1$ decay constant.

$T_2$=the transverse (or spin-spin) relaxation time $T_2$ is the decay constant for a proton spin component.

TR=repetition time, the time between successive RF excitation pulses.

FA=flip angle, i.e., an RF flip angle. For an inversion pulse, FA=180 degrees.

water-frequency selective inversion recovery module (WF-SIRM)=a pulse sequence including at least one frequency-selective radio-frequency pulse, that is played to provide an inverted MR signal associated with the frequency of the water component of the MR signal.

fat-frequency selective inversion recovery module (WF-SIRM)=a pulse sequence including at least one frequency-selective radio-frequency pulse, that played to provide an inverted MR signal associated with the frequency of the fat component of the MR signal.

Segmented data acquisition records the different parts of raw data space (the segments) in a periodic fashion by repeatedly playing out a pulse sequence comprising an inversion pulse sequence and MR data acquisition pulses and acquiring a different set of k-space lines during readout (acquisition). FIG. 1 shows an exemplary timing diagram of such a segmented sequence (gated using an ECG trigger but this is not required), and indicating how the data is placed to the raw data space.

The system and processes of FIGS. 1-12 are not exclusive. Other systems, processes and menus may be derived in accordance with the principles of the invention to accomplish the same objectives. Although this invention has been described with reference to particular embodiments, it is to be understood that the embodiments and variations shown and described herein are for illustration purposes only. Modifications to the current design may be implemented by those skilled in the art, without departing from the scope of the invention. A system provides fat signal suppression (fat nulling) by selectively restoring and later inverting fat magnetization and acquiring image-contrast relevant data (the center of k-space) when the fat T1-recovery curve crosses the zero-magnetization line. Further, the processes and applications may, in alternative embodiments, be located on one or more (e.g., distributed) processing devices on a network linking the units of FIG. 1. Any of the functions and steps provided in FIGS. 1-12 may be implemented in hardware, software or a combination of both.

What is claimed is:

1. An MR (Magnetic Resonance) imaging system for independently manipulating a fat and a water component of MR signals used for generating image data, comprising:
    an RF (Radio Frequency) signal generator and a magnetic field gradient generator for providing an RF pulse and magnetic field gradient sequence for acquisition of an MR signal discriminating between anatomical objects based on longitudinal relaxation time (T1), said RF pulse and magnetic field gradient sequence comprising:
        a first pulse sequence for selectively inverting a water component of the MR signal substantially exclusively of fat,
        a second pulse sequence having a resonant frequency selected to invert a fat component of the MR signal substantially exclusively of water,
        a data acquisition magnetic field gradient for a data acquisition of said MR signal, and
        a first time delay following said first pulse sequence and prior to said data acquisition, the first time delay being adjustable to discriminate between different anatomical elements; and
    an image data processor for processing the acquired MR signal to provide a display image with enhanced visualization of discriminated anatomical elements,
    wherein said first pulse sequence includes a frequency non-selective inversion recovery RF pulse inverting an MR signal from both water and fat, and a fat selective inversion recovery RF pulse having a resonant frequency selected to invert a fat component of the MR signal substantially exclusively of water, and
    wherein said fat selective inversion recovery RF pulse is provided substantially immediately preceding or following said non-selective inversion recovery RF pulse, leaving a fat signal component of the MR signal substantially unchanged.

2. A system according to claim 1, wherein said RF pulse and magnetic field gradient sequence further comprises a second time delay following said second pulse sequence and prior to said data acquisition, said second time delay being selected so that longitudinal magnetization of fat is substantially zero at a central contrast-relevant portion of said data acquisition of said MR signal to suppress a fat signal component.

3. A system according to claim 2, wherein said first time delay is selected to reduce an MR signal component of water to substantially zero at said central contrast-relevant portion of said data acquisition of said MR signal to provide T1-weighting of water and concurrently suppress a fat signal component.

4. A system according to claim 2, wherein
    said second time delay plus a time interval from the beginning of said data acquisition to said central contrast-relevant portion of said data acquisition substantially equals an inversion time of a fat component.

5. A system according to claim 4, wherein
    a time interval from an end of said first pulse sequence to said central contrast-relevant portion of said data acquisition substantially equals an inversion time of a water component.

6. A system according to claim 5, wherein
    the inversion time of the water component is a function of at least two of, static magnetic field strength, dose of contrast agent injected, time elapsed after the injection, patient physiology and an imaging acquisition duration.

7. A system according to claim 2, wherein
    said RF pulse and magnetic field gradient sequence provides fat-suppressed delayed enhancement imaging.

8. A system according to claim 1, wherein
    said MR signal is acquired using at least one of, (a) gradient echoes, (b) spin echoes, (c) steady-state free precession, (d) a segmented data acquisition and (e) acquisition of MR signals as single shots.

9. A system according to claim 1, wherein
    said RF (Radio Frequency) signal generator generates RF excitation pulses in an anatomical region of interest and enables subsequent acquisition of associated RF echo data and said magnetic field gradient generator generates magnetic field gradients for phase encoding and readout RF data acquisition.

10. A system according to claim 1, wherein said image data processor processes said MR signal using a reference data set to provide a phase sensitive image reconstruction (PSIR).

11. A system according to claim 10, including a second time delay following said second pulse sequence and prior to said data acquisition, said second time delay being selected so that longitudinal magnetization of fat is substantially negative at a central contrast-relevant portion of said data acquisition of said MR signal to depict fat dark in a PSIR image.

12. A system according to claim 10, wherein said first time delay is selected to provide T1-weighting of water while concurrently depicting fat dark in a PSIR image.

13. A system according to claim 10, wherein said first time delay is selected to reduce the longitudinal magnetization of water to substantially zero at a central contrast-relevant portion time of said data acquisition to provide T1-weighting of water while concurrently depicting fat dark in a PSIR image.

14. A system according to claim 1, wherein said image data processor processes said MR signal to provide a phase sensitive image reconstruction (PSIR).

15. A system according to claim 1, wherein said RF pulse and magnetic field gradient sequence further comprises a second time delay following said first pulse sequence and prior to said second pulse sequence, said second time delay being selected to provide T1-weighting of water while concurrently depicting fat dark in the image.

16. An MR (Magnetic Resonance) imaging system for independently manipulating a fat and a water component of MR signals used for generating image data, comprising:
an RF (Radio Frequency) signal generator and a magnetic field gradient generator for providing an RF pulse and magnetic field gradient sequence for acquisition of an MR signal discriminating between anatomical objects based on longitudinal relaxation time (T1), said RF pulse and magnetic field gradient sequence comprising:
a first pulse sequence for selectively inverting a water component of the MR signal substantially exclusively of fat,
a second pulse sequence having a resonant frequency selected to invert a fat component of the MR signal substantially exclusively of water,
a data acquisition magnetic field gradient for a data acquisition of said MR signal, and
a first time delay following said second pulse sequence and prior to said data acquisition, where a duration of the first time delay is selected so that longitudinal magnetization of fat is substantially zero at a central contrast-relevant portion of said data acquisition of said MR signal to suppress a fat signal component, and
an image data processor for processing the acquired MR signal to provide a display image with enhanced visualization of discriminated anatomical elements,
wherein said first pulse sequence includes a frequency non-selective inversion recovery RF pulse inverting an MR signal from both water and fat, and a fat selective inversion recovery RF pulse having a resonant frequency selected to invert a fat component of the MR signal substantially exclusively of water, and
wherein said fat selective inversion recovery RF pulse is provided substantially immediately preceding or following said non-selective inversion recovery RF pulse, leaving a fat signal component of the MR signal substantially unchanged.

17. A system according to claim 16, wherein said RF pulse and magnetic field gradient sequence further comprises a second time delay following said first pulse sequence and prior to said data acquisition, the second time delay being adjustable to discriminate between different anatomical elements.

18. An MR (Magnetic Resonance) imaging method for independently manipulating a fat and a water component of MR signals used for generating image data, comprising:
providing an RF (Radio Frequency) signal generator and a magnetic field gradient generator for providing an RF pulse and magnetic field gradient sequence for acquisition of an MR signal discriminating between anatomical objects based on longitudinal relaxation time (T1);
generating a first pulse sequence using the RF signal generator to selectively invert a water component of the MR signal substantially exclusively of fat using the RF signal generator;
providing a first time delay following said first pulse sequence and prior to a data acquisition to discriminate between different anatomical elements;
generating a second pulse sequence using the RF signal generator that has a resonant frequency selected to invert a fat component of the MR signal substantially exclusively of water,
activating a data acquisition magnetic field gradient;
acquiring said MR signal while the data acquisition magnetic field gradient is activated; and
processing the acquired MR signal to provide a display image with enhanced visualization of discriminated anatomical elements,
wherein generating said first pulse sequence comprises generating a frequency non-selective inversion recovery RF pulse inverting an MR signal from both water and fat, and generating a fat selective inversion recovery RF pulse substantially immediately preceding or following generation of said non-selective inversion recovery RF pulse, and wherein said fat selective inversion recovery RF pulse has a resonant frequency selected to invert a fat component of the MR signal substantially exclusively of water, thereby leaving a fat signal component of the MR signal substantially unchanged.

19. A method according to claim 18, further comprising providing a second time delay following said second pulse sequence and prior to said data acquisition, said second time delay being selected such that longitudinal magnetization of fat is substantially zero at a central contrast-relevant portion of said data acquisition of said MR signal to suppress a fat signal component.

20. A method according to claim 19, wherein said first time delay is selected to reduce an MR signal component of water to substantially zero at said central contrast-relevant portion of said data acquisition of said MR signal to provide T1-weighting of water and concurrently suppress said fat signal component.

* * * * *